United States Patent
Cellier et al.

(10) Patent No.: US 8,907,721 B2
(45) Date of Patent: Dec. 9, 2014

(54) OFFSET CANCELLATION FOR AUDIO AMPLIFIER

(75) Inventors: Rémy Cellier, Grenoble (FR); François Amiard, Grenoble (FR)

(73) Assignees: ST-Ericsson SA, Plan-les-Ouates (CH); ST-Ericsson (Grenoble) SAS, Grenoble (FR)

(*) Notice: Subject to any disclaimer, the term of this patent is extended or adjusted under 35 U.S.C. 154(b) by 257 days.

(21) Appl. No.: 13/322,868

(22) PCT Filed: May 28, 2010

(86) PCT No.: PCT/EP2010/057444
§ 371 (c)(1),
(2), (4) Date: Nov. 28, 2011

(87) PCT Pub. No.: WO2010/136578
PCT Pub. Date: Dec. 2, 2010

(65) Prior Publication Data
US 2012/0133430 A1    May 31, 2012

(30) Foreign Application Priority Data
May 29, 2009   (FR) ..................... 09 53598

(51) Int. Cl.
H03F 1/02 (2006.01)
H03F 1/30 (2006.01)
H03F 3/187 (2006.01)
H03F 3/45 (2006.01)

(52) U.S. Cl.
CPC .............. *H03F 1/305* (2013.01); *H03F 3/187* (2013.01); *H03F 3/45192* (2013.01); *H03F 3/45744* (2013.01); *H03F 2200/03* (2013.01); *H03F 2200/375* (2013.01); *H03F 2203/45354* (2013.01); *H03F 2203/45371* (2013.01); *H03F 2203/45396* (2013.01); *H03F 2203/45424* (2013.01); *H03F 2203/45438* (2013.01)
USPC ............................................. 330/9

(58) Field of Classification Search
USPC .................. 330/9, 51; 327/124, 307
See application file for complete search history.

(56) References Cited

U.S. PATENT DOCUMENTS 5,061,900 A * 10/1991 Vinn et al. ............ 330/9
6,459,335 B1 * 10/2002 Darmawaskita et al. ...... 330/9

(Continued)

OTHER PUBLICATIONS

Patent Cooperation Treaty International Search Report and Written Opinion of PCT/EP2010/057444; Filip Goethals; Aug. 12, 2010; 7 pages.

(Continued)

*Primary Examiner* — Khanh V Nguyen
(74) *Attorney, Agent, or Firm* — Howison & Arnott, LLP (57) ABSTRACT

An audio amplification circuit is provided having an amplifier that receives an input signal, an output, and a digital control input for receiving a control value in a number n of bits; a comparator having a first input that receives the amplifier's output signal image, a second input that receives a reference potential, and an output; and a thermometer counter having a selection input coupled to the comparator output, and an output delivering an n-bit digital value to the amplifier control input. The amplifier comprises a differential input stage having a first and a second differential branch, each traversed by a bias current, the current in the first branch being modifiable by n basic current sources which each deliver either a current identical for all current sources, or no current, as a function of one respective bit of the digital control value received at the control input.

19 Claims, 5 Drawing Sheets

(56) References Cited

U.S. PATENT DOCUMENTS

| | | |
|---|---|---|
| 7,245,169 B2 * | 7/2007 | Kishii .......................... 327/307 |
| 7,321,260 B2 | 1/2008 | Larson |
| 7,368,968 B1 * | 5/2008 | Lai et al. .......................... 330/9 |
| 7,368,983 B2 | 5/2008 | Nishimori |
| 2005/0030081 A1 | 2/2005 | Kishii |
| 2006/0071693 A1 | 4/2006 | Higuchi et al. |
| 2008/0048773 A1 | 2/2008 | Fahim et al. |

OTHER PUBLICATIONS

Institut National De La Propriete Industrielle; Rapport de Recherche Preliminaire; French Search Report and Written Opinion; Filip Goethals; Jan. 8, 2010; 7 pages.

An Automatic Offset Compensation Scheme with Ping-Pong Control for CMOS Operational Amplifiers; Chong-Gun Yu and Randall L. Geiger; IEEE Journal of Solid-State Circuits, vol. 29, No. 5, May 1994, pp. 601-610.

* cited by examiner

OFFSET CANCELLATION FOR AUDIO AMPLIFIER

CROSS-REFERENCE TO RELATED APPLICATIONS

This application is a U.S. National Phase application submitted under 35 U.S.C. §371 of Patent Cooperation Treaty application serial no. PCT/EP2010/057444, filed May 28, 2010, and entitled OFFSET CANCELLATION FOR AUDIO AMPLIFIER, which application claims priority to French patent application serial no. FR 09 53598, filed May 29, 2009, and entitled OFFSET CANCELLATION FOR AUDIO AMPLIFIER.

Patent Cooperation Treaty application serial no. PCT/EP2010/057444, published as WO 2010/136578, and French patent application serial no. FR 09 53598, are incorporated herein by reference.

TECHNICAL FIELD

The invention relates in general to the amplification of audio signals, and in particular to offset cancellation for an audio amplifier.

The invention has applications, in particular, in the integrated circuits equipping devices that have an audio signal reproduction function, such as mobile telephones, portable MP3 or MP4 players, etc. In such an application, the audio amplifier is designed to drive the speaker or headset jack of the device.

BACKGROUND

When the audio amplifier is powered on, this produces unwanted noise which is called a "pop" by those skilled in the art. This pop is considered to be an audible defect to the user of the device. It is unpleasant to hear, particularly when listening through headphones or earphones.

Figure 1:
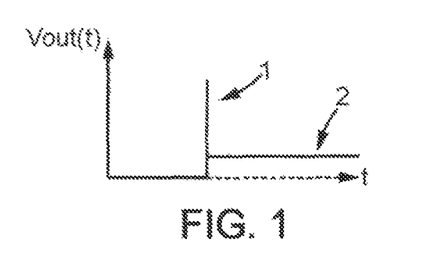

FIG. 1 shows the evolution over time of the output voltage Vout(t) of the audio amplifier at power-on, in the absence of an input signal to the amplifier. The pop arises from the generation of a voltage peak 1, which is called a glitch, and the presence of a non-zero voltage level 2 corresponding to the offset voltage of the amplifier.

This offset voltage results from an imbalance between the two static currents respectively established in each of the two branches of the differential pair that forms the input stage of the amplifier.

In practice, it is not uncommon to observe offset voltages of around ±10 mV. A "pop" corresponding to a transient variation of 1 mV in the output can be heard by a user.

The offset voltage also causes static power consumption, which corresponds to the product of the offset voltage and the load impedance. In the applications envisaged here, the device is generally battery-powered, and reducing the static power consumption is desirable.

Techniques exist for decreasing the unwanted noise in the audio signal reproduced for the user, arising from the offset voltage of the audio amplifier. In principle, the techniques previously considered here consist of observing the output voltage from the amplifier in the absence of an input signal, and controlling an offset cancellation means internal to the amplifier.

Such a technique is present in the article in the IEEE Journal Of Solid-State Circuits, Vol. 29, No. 5, May 1994, entitled "An Automatic offset compensation scheme with Ping-Pong control for CMOS operational amplifier". However, the solution in this article does not apply to the audio applications envisaged, because of the lack of linearity in the offset cancellation that it provides.

SUMMARY

There is therefore a need for a solution that eliminates, or at least attenuates, the offset voltage of an audio amplifier.

For this purpose, an audio amplifier circuit is proposed comprising an amplifier having an input for receiving an input signal, an output, and a digital control input for receiving a control value in a number n of bits; a comparator having a first input coupled to the output of the amplifier in order to receive an image of the output signal from the amplifier, a second input receiving a reference potential, and an output; and a thermometer counter, having a selection input coupled to the output of the comparator, and an output delivering an n-bit digital value (COR) which is provided to the control input of the amplifier.

Advantageously, the amplifier comprises a differential input stage having a first and a second differential branch each traversed by a bias current, with the current in the first branch being modifiable by n basic current sources which each deliver either a basic current which is identical for all basic current sources, or no current, depending on the binary value of one of the respective bits of the digital control value received at the control input.

This allows obtaining a correction of the offset of the audio amplifier which is monotonic and linear, in the sense that the decrease in the offset voltage decreases with a constant slope, in rhythm with a clock signal which defines the timing of the thermometer counter.

When the amplifier is a class AB amplifier, which provides good amplification efficiency, the reference potential of the comparator is the ground potential.

The amplifier can comprise a current source acting on the second branch of the differential stage in order to unbalance the respective currents in the first and second branches of the differential stage, for a zero input signal and for a control value corresponding to an absence of change in the bias current in the first branch of the differential stage.

Preferably, the current source acting on the second branch of the differential stage in order to unbalance the respective currents in the first and second branches of the differential stage is configured to deliver a current substantially equal to $(n \times Io)/2$, where Io is the value of the basic current delivered by each of the basic current sources which allow modifying the current in the first branch of the differential stage.

In this manner, the sign of the amplifier offset can be forced to a sign which is still the same (positive or negative), which simplifies its correction. In other words, one knows in which direction the bias currents need to be rebalanced, because this is still the same. Also, one knows that it is possible to correct the offset during a count cycle of the thermometer counter.

In order to eliminate effects of any offset in the comparator, the comparator is an automatic zero-adjustment comparator.

Preferably, the comparator comprises a first stage which is a differential stage with automatic zero adjustment, followed by a second stage which does not have automatic zero adjustment, and an analog latch.

The second stage contributes to increasing the sensitivity, by providing additional gain. Its offset, if any, is divided by the gain of the first stage in the output signal from the comparator, and this is why it is not essential to correct it. The comparator structure is then simpler.

In an embodiment suitable for amplification of an audio signal, the counter frequency is equal to about 32 kHz, and n is equal to 94.

The invention also concerns an audio amplification method using an amplifier having an input for receiving an input signal, an output, and a digital control input for receiving a control value in a number n of bits, comprising the steps of comparing an image of the output signal from the amplifier with a reference potential; and generating an n-bit digital value that is provided to the control input of the amplifier, with a thermometer counter having a selection input coupled to the comparator output.

The current is modified in a first branch of a differential input stage of the amplifier having said first branch and a second differential branch each traversed by a bias current, by n basic current sources which each deliver either a basic current which is identical for all basic current sources, or no current, as a function of the binary value of one of the respective bits of the digital control value received at the control input.

The invention further concerns a device comprising an audio signal source and an amplification circuit as defined above, for amplification of the audio signal.

BRIEF DESCRIPTION OF THE DRAWINGS

Other features and advantages of the invention will be apparent from reading the following description. This description is purely illustrative and is to be read in light of the attached drawings, in which:

FIG. 1, already discussed, shows a graph over time of the output voltage from an audio amplifier without glitch or offset correction, when the amplifier is powered on;

DETAILED DESCRIPTION

Figure 2:
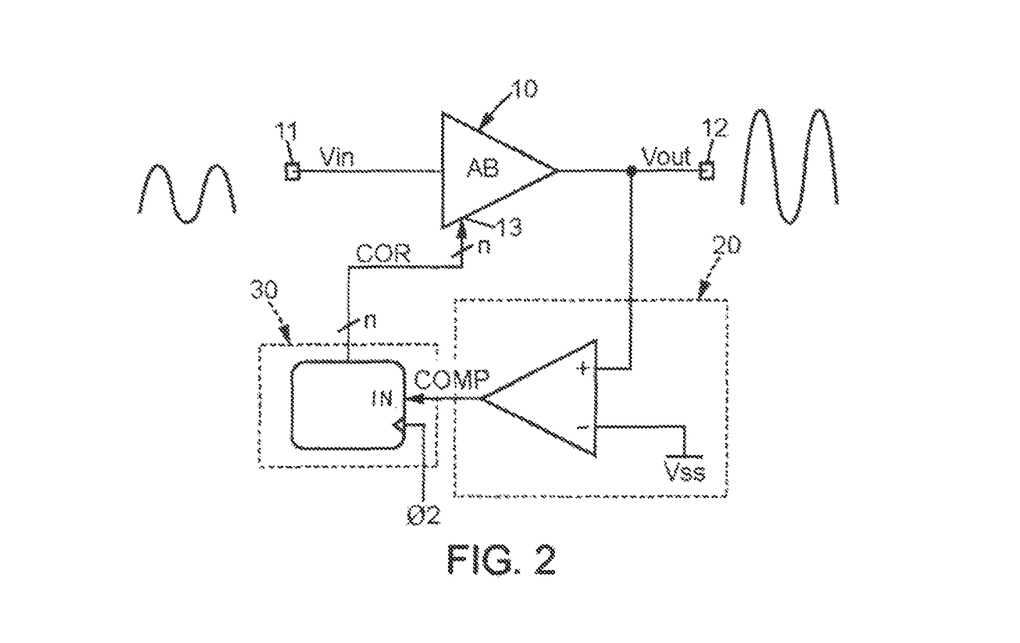
FIG. 2 is a block diagram illustrating the principle of offset cancellation according to embodiments of the invention.

FIG. 2 schematically represents an example of an audio amplification circuit incorporating offset cancellation according to the principle used by embodiments of the invention.

The audio amplification circuit comprises an input 11 for receiving an audio input signal Vin to be amplified. It also comprises an output 12 for delivering an audio output signal Vout corresponding to the amplified signal Vin.

The input signal is typically a differential voltage defined by the difference between two components: V+ and V−.

The signal Vout is a voltage suitable for driving a sound reproduction device such as a speaker or headset. Typically, the output 12 drives a speaker of the device in which the audio amplification circuit is used, or a jack of this device to which a headset, earphones, or an external speaker can be connected.

In the present description, and unless specifically indicated otherwise, all the voltages mentioned are relative to a reference potential Vss. This can be a ground potential. It is also understood that unless otherwise stated, the phenomena described here occur before an input signal Vin is applied to the input 11. In other words, V+=V−.

The amplification circuit comprises an amplifier 10, typically a class AB amplifier. This is a differential amplifier, such as an operational amplifier. Such an amplifier comprises an input stage with a differential pair of transistors. Here, the transistors are MOS transistors. The device is for example realized using CMOS technology ("Complementary MOS"). Details of an example of the input stage of the amplifier 10 will be given below with reference to FIG. 4.

Typically, the operating point of the amplifier 10 is in the middle of the range of available voltages, meaning for example at a voltage equal to Vdd−Vss)/2 for an audio amplifier supplied a voltage between a positive power supply voltage Vdd and said potential Vss. This obtains the maximum dynamic range for amplification of the input signal Vin. For example, the amplifier has an input stage with a differential structure, which amplifies the difference between the V+ and V− components of the input signal Vin. The operating point of the amplifier 10 is obtained by imposing a static current in each of the two branches of the differential pair that constitutes its input stage, with these two currents in principle needing to have the same value so that the differential pair is balanced and the amplifier has no offset.

An offset voltage of the amplifier 10 arises from imbalance between the two static currents mentioned above, or bias currents. Such an imbalance is inherent to the creation of an amplifier on silicon. It results from variations in the characteristics of components, i.e. MOS transistors, which are the basic elements of an amplifier created on silicon.

The amplifier 10 comprises internal offset corrections means for correcting the imbalance between the bias currents of the differential pair. These means are controlled from outside the amplifier, via an input 13, by an offset cancellation means, which here comprises a comparator 20 and a thermometer code generator 30.

The comparator 20 comprises two inputs and one output. The first input (designated by a "+" sign in FIG. 2) is coupled to the output 12 of the amplification circuit, in order to receive an image of the output signal Vout, meaning the voltage Vout(t). The second input (denoted by the "−" sign in FIG. 2) receives a reference voltage. When the amplifier 10 is a class AB amplifier, whose output voltage in common mode is theoretically, i.e. without offset, equal to zero, this reference voltage is the zero voltage. In this case, the "−" input is for example coupled to the ground of the circuit. In other words, in this case, the offset of the amplifier 10 is determined by comparing its output voltage Vout(t) to zero.

The accuracy of this comparison is affected by various parameters, including the possible existence of an offset in the comparator 20. This is why, in order to increase this accuracy, an automatic zero-adjustment comparator is preferably used, also called an auto-zero comparator. The principle of such a comparator and an advantageous embodiment will be described below with reference to FIG. 7.

Still with reference to FIG. 2, the output from the amplifier 20 delivers a signal COMP which drives a validation input or selection input IN of the generator 30. The generator can, for example, comprise a modulo-n counter, where n is an integer greater than one. This counter has an n-bit digital output. It generates and outputs a correction COR which corresponds to an n-bit thermometer code. For example, it can be a Johnson counter or a derivative of such a counter. It is clocked by a clock signal Φ2 received at a clock input, which will be discussed in more detail below.

Figure 3:
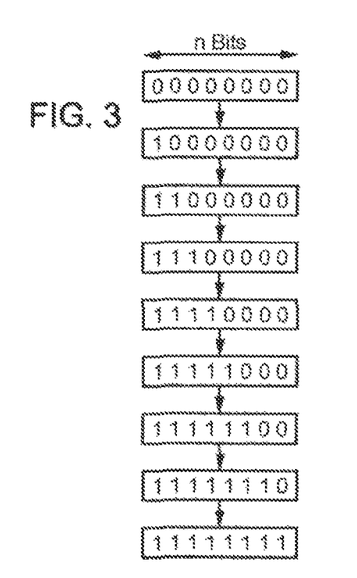
FIG. 3 represents the transition diagram of a thermometer counter with an 8-bit output.

The operation of the counter 30 can be summarized by its transition diagram, of which an example is represented in FIG. 3, with n=8. Such a diagram represents all the output values from the counter for a complete counter cycle.

As can be seen in this example, the characteristic of a thermometer counter is that, starting from an initial value in which all bits are 0, a bit changes from 0 to 1 at each transition, while the other bits do not change value. In the example represented, the n bits successively change to 1 starting with the most significant bit (MSB) and ending with the least significant bit (LSB). The reverse is also possible, meaning starting with the LSB and ending with the MSB. The counter is designed in such a way that it is reset to zero when the circuit is powered on. In this state, all the bits of the output value COR are at the logical value of 0. A person skilled in the art knows how to design a counter realizing these transitions.

Returning to FIG. 2, the output signal COR from the thermometer code generator 30 is provided to the offset correction input 13 of the amplifier 10. It constitutes an offset cancellation signal, which is an n-bit digital signal.

In the context of the invention, the transitions of the counter are controlled at the pace of the clock signal described above, while the output signal from the comparator is in a logical stage indicating that the output voltage Vout(t) from the amplifier 10 is not zero. For example, this directly concerns the activation state of the counter via its input IN, for example the high logical state.

The entire system is calibrated such that this condition (Vout(t)=0) must be met by one of the n output values of the counter 30, as will now be explained.

Figure 4:
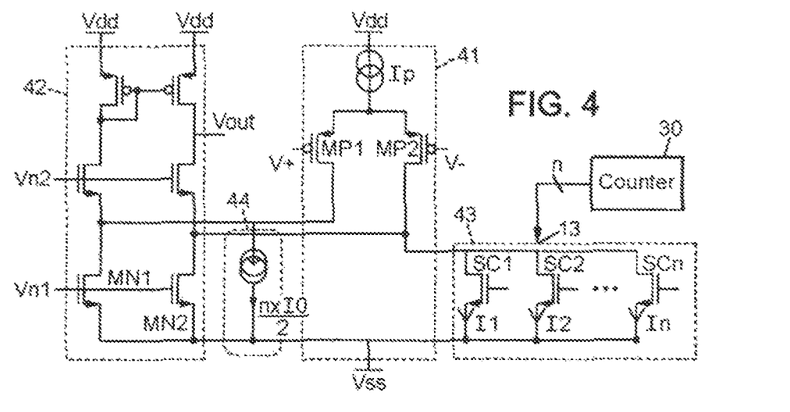
FIG. 4 is a detailed diagram of one embodiment of the audio amplifier with its internal offset correction means.

FIG. 4 details an exemplary embodiment of the amplifier 10. It comprises an input stage 41, an output stage 42, and a current source network 43.

The input stage 41 comprises a differential pair of MOS transistors. These are for example two identical PMOS transistors, respectively MP1 and MP2, arranged as a differential pair. The transistor MP1 receives the positive component V+ of the input signal Vin, and the transistor MP2 receives its negative component V−. The sources of MP1 and MP2 are connected together, through a current source, to a high supply terminal brought to the voltage potential Vdd. In an example considered here, the positive supply voltage Vdd is equal to about 2 V. The current source delivers a bias current Ip. For example, the source is realized by a PMOS transistor whose substrate electrode is brought to the voltage Vdd and whose control gate receives a constant bias voltage, whose amplitude determines the value of the current Ip.

The drain of the transistor MP1 is connected to a terminal brought to the ground potential Vss, through an NMOS transistor. Similarly, the drain of the transistor MP2 is connected to the ground terminal through another NMOS transistor, identical to the previous one. These two transistors, respectively MN1 and MN2, are therefore each traversed by a "static balancing current". Static balancing current is understood to mean a current established in the absence of a signal Vin to be amplified, meaning when Vin(t)=0, i.e. when V+=V−. These transistors MN1 and MN2 are part of the output stage 42.

This ideal situation, which corresponds to a perfect balance between the two branches of the differential pair respectively comprising the transistors MP1 and MN1 and the transistors MP2 and MN2, is never completely achieved in practice. This is due to imperfections when these transistors are created on silicon. An imbalance causes an offset voltage at the amplifier output, meaning that the output voltage Vout(t) is not equal to zero when the voltage Vin(t) is zero.

The output stage 42 of the amplifier 10 has a "folded cascode" structure. More particularly, it comprises a pair of PMOS transistors whose sources are connected to the high supply terminal Vdd, and which are arranged with current mirroring: their control gates are connected together and one of them has its control gate connected to its drain. The output signal Vout from the amplifier 10 is taken from the drain of the other transistor. The drains of these two PMOS transistors are coupled to the ground terminal Vss, each through two cascoded NMOS transistors. The control gates of the NMOS transistors of each cascode stage receive the same bias voltage, meaning a voltage Vn1 for the lower stage comprising MN1 and MN2 (which is next to Vss) and a voltage Vn2 for the upper stage (the one which is next to Vdd and the PMOS transistors). The pair of middle points, i.e. between the two cascode stages of the stage 42, is thus connected to the pair of output nodes of the differential input stage 41, meaning to the drain of transistors MP1 and MP2, respectively. This structure of the output stage 42 allows high accuracy in recopying output currents from the differential pair of the input stage 41, even for a low supply voltage Vdd. High precision is therefore obtained in the value of the output signal Vout. In addition, this structure of the stage 42 limits power consumption in stable mode, and is little affected by variations in component temperatures.

The audio amplifier also comprises a matrix of controlled current sources 43. More precisely, the matrix 43 comprises n controlled sources, respectively SC1 to SCn. The control input of this matrix corresponds to the offset correction input 13 of the audio amplifier. It receives the n-bit digital value COR produced by the counter 30, which is also shown in FIG. 4.

A decoding logic (not represented) ensures that each of the current sources SC1 to SCn is controlled by one of the bits of the offset correction signal COR delivered by the counter 30. For example, the source SC1 is controlled by the most significant bit, and the source SCn is controlled by the least significant bit, and so on for the bits of intermediate rank between the MSB and the LSB. Thus, a source SC<i> delivers current when the bit of rank i in the offset correction signal is 1, while it is off (delivering no current) when this bit is 0.

The value of the current delivered by each of the sources SC1, SC2, ..., SCn, is respectively denoted as I1, I2, ..., In. In order to obtain a linear offset correction, all these currents are equal to a same value Io. In other words, I1=I2= ... = In=Io. This is obtained by realizing the matrix 43 in the form of a matrix of "matched" transistors. Such transistors are realized during the same silicon integration steps and are connected so as to be current mirroring.

The sources of each of the n transistors SC1 to SCn are connected to the source of the transistor MN2, and therefore to the ground Vss. Their drains are connected to the drain of the transistor MN2. In other words, the sources SC1 to SCn are connected in parallel with the transistor MN2 such that their current, respectively I1 to In, discharges the output node of the differential stage 41 which corresponds to the drain of the transistor MN2.

Each time one more source is turned on, this node is discharged by a supplemental current Io. This discharge allows correcting the imbalance between the currents flowing in each of the branches of this differential pair. The value of the current Io is substantially less than Ip/2, for example 100 times smaller. In fact, Io is chosen to be able to correct the difference between the theoretical value of Ip/2 and its actual observed value, considering the variations in the characteristics of the components, and does this in at most n correction steps during each of which one more current source is turned on among the n sources SC1 to SCn.

In an example, where an offset of ±15 mV is to be corrected, Io=100 nA and n=94 are chosen. These values for Io and n allow covering the entire range of offset voltages, between −15 mV and +15 mV.

Figure 5A:
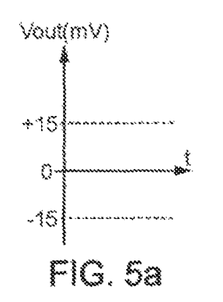
FIGS. 5a-5c are diagrams illustrating the ranges of variation in the offset voltage of the audio amplifier, and its evolution within these ranges.
Figure 5B:
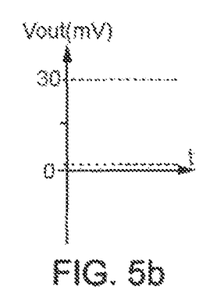

In order to guarantee that the offset correction is monotonic, a current source 44 is preferably added between the other output node of the differential input stage 41, meaning the drain of the transistor MN1, and the ground terminal Vss. This current source is designed to deliver a current equal to about n×i0/2. These values give an offset voltage of +15 mV at the output. In this manner one is certain to have a positive output voltage, of between 0 and +30 mV, for an imbalance between the two branches of the differential input stage 41 which in principle gives an offset of ±15 mV. This interval is symbolized by the dotted horizontal lines in FIG. 5b.

Figure 5C:
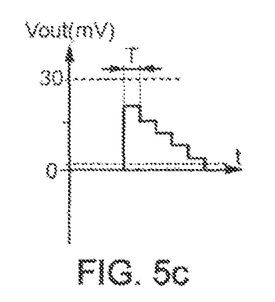

Thus, when the offset voltage appears at power-on of the audio amplification circuit, it is always located at a positive value of between 0 and 30 mV, and it decreases in successive steps each time a current source among the sources SC1 to SCn is turned on. This results in a stair-step evolution of the voltage Vout(t) which is decreasing and monotonic, as is visible in FIG. 5c. More particularly, the voltage Vout (t) decreases in a stair-step manner, from an initial value of between 0 and 30 mV when the circuit is powered on, down to 0. The height of each stair corresponds to the contribution of the current i0 which is added in order to discharge the drain of the transistor MN1, each time a current source among the sources SC1 to SCn is turned on. The width of each stair corresponds to the period T of the clock signal.

Figure 6:
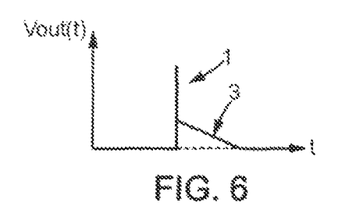
FIG. 6 is a graph over time of the output voltage at power-on from an audio amplifier with offset correction according to embodiments of the invention.

To summarize, with reference to the graph in FIG. 6 in comparison to the one in FIG. 1, the voltage segment denoted by the reference 2 in FIG. 1 is replaced in the signal Vout(t) by a decreasing slope 3 which ends at 0 at the end of a period of time corresponding to n×T.

The monotonic characteristic of the decrease in the offset voltage Vout(t) to 0, starting from the initial value when the audio amplifier is powered on, is advantageous because it improves the precision of the offset correction. In fact, if the current source matrix 43 were directly controlled by a decoding of a binary value corresponding to a measurement of the offset at given moments, the more or less random turning on and off of the various current sources of the matrix could give rise to alternating charges and discharges of the node corresponding to the drain of the transistor MN1. For example, if from one period of the clock signal to the next, the value changes from a number corresponding to eight units (the number 1000 in binary) to a number corresponding to seven units (the number 0111 in binary), there is nothing to guarantee that the sum of the currents generated by the three sources which are turned on by this transition (corresponding to the three least significant bits) is less than the current of the source which is turned off (corresponding to the most significant bit). In fact, with the uncertainties inherent in realizing components on silicon, this cannot be guaranteed. With a controlled current source matrix as described with reference to FIG. 4, given that a compensation current is added at each step to the sum of the currents which were already added in the previous step, such a decrease in the compensation current cannot occur.

As has been said, the comparator 20 is preferably an auto-zero comparator. Such a comparator has the advantage of being without its own offset voltage with regard to the comparison between the two voltage levels received as input. Its principle is illustrated schematically in FIG. 7.

Figure 7:
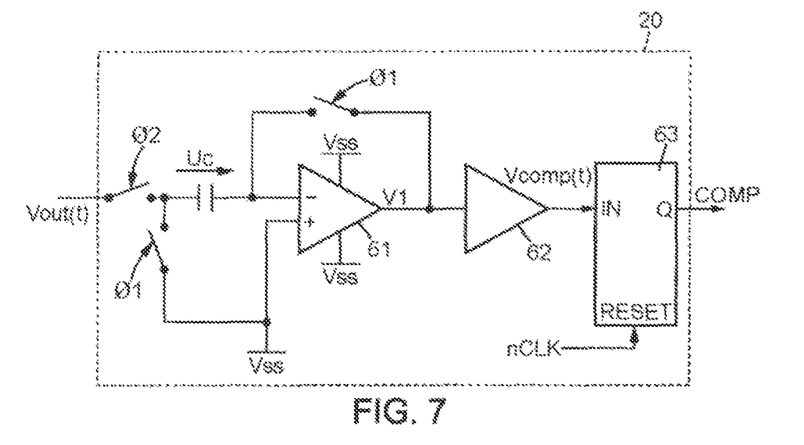
FIG. 7 illustrates the schematic diagram of an auto-zero comparator used in embodiments of the invention.

In FIG. 7, the signal Vout(t) to be compared is provided to the "−" input of a comparator stage 61, through a switch controlled by a signal Φ2 and a capacitor. The output from the stage 61 is looped to this input through a second switch controlled by a signal Φ1. The other input, the "+" input of the stage 61, is connected to the reference voltage to which the voltage Vout(t) is compared, meaning the zero voltage of the ground potential Vss in the example. Lastly, a third switch controlled by the same signal Φ1 allows coupling the plate of the capacitor which is opposite the "−" input, to the other input "+".

The operation of the comparator is as follows. In a first phase, the switches controlled by the signal Φ1 are closed (for example in the high logic state) and the switch controlled by the signal Φ2 is open (the signal Φ2 being for example in the low state). The amplifier 61 is then arranged in an amplifier follower configuration. In other words, the output voltage Vcomp(t) is stored in the capacitor. As the signal Vout(t) is not applied to the input, this voltage corresponds only to the offset voltage of the amplifier 61. In a second phase, it is the reverse: the switch controlled by Φ2 is closed and those controlled by Φ1 are open. The amplifier is then in the comparator configuration. The voltage which is compared to the zero voltage is then the voltage Vout(t) increased by the voltage UC stored in the comparator, meaning the offset voltage of the amplifier. Thus, the voltage Vcomp(t) output from the comparator 61 during this second phase corresponds to an actual comparison of the signal Vout(t) with the zero voltage. One understands by this that the offset voltage of the amplifier 61 is eliminated from this comparison.

Figure 8A:
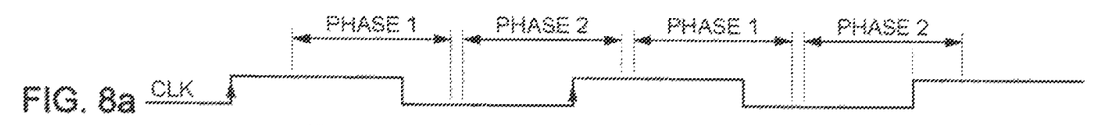
FIGS. 8a to 8i show timing charts for the clock signals, control signals, and voltages of the amplification circuit.
Figure 8B:
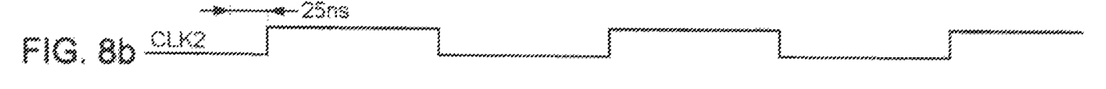
Figure 8C:
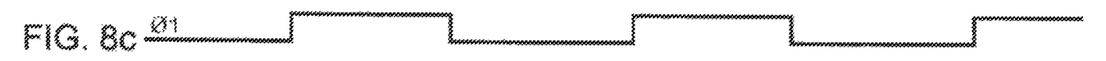
Figure 8D:
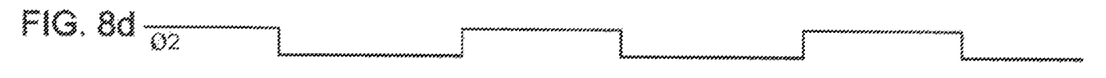

An exemplary embodiment of the comparator 20 will now be discussed with reference to FIGS. 7 and 8. In order to increase the sensitivity, one wants to increase the gain of the comparator. For this purpose, the amplifier 61 is followed by a second amplification stage 62. Again this can be an amplifier of a differential structure. In order to simplify the architecture of the circuit, it can be implemented such that no special measures are taken to eliminate the offset of this amplification stage. Even so, the contribution of this offset is reduced by a factor G relative to that of the first stage 61, where G is the gain of the stage 61. In other words, it is primarily the offset of the first stage 61 which influences the results of the comparison, which is why that stage benefits from offset compensation according to the principle of the auto-zero comparator described above.

The voltage Vcomp(t) which corresponds to the difference between the signal Vout(t) and the zero voltage, after amplification by the stages 61 and 62, drives the input of an output latch 63. This can be an analog latch. This latch comprises an output Q and an input IN, which can be a differential input when the output from the amplifier 62 is a differential output. In one embodiment, the latch 63 is additionally equipped with a reset input. Advantageously, this reset input receives a clock signal nCLK which corresponds to the inverse logic of the above-mentioned clock signal CLK. At each rising edge of the signal nCLK, the output Q of the latch 63 is reset, no matter what the input signal IN. In other words, the latch 63 is maintained in a reset state for half of the time, corresponding to the half-periods during which the signal nCLK is in the high state.

The sequence of the various signals which clock the audio amplifier operation will now be explained, with reference to the diagrams in FIGS. 8a to 8i.

FIG. 8A shows the clock signal CLK. This is a periodic square-wave signal, with a frequency for example of 32 kHz in the audio applications considered. From this signal, a second clock signal CLK2 is generated, by a means not represented. This signal CLK2 corresponds to the signal CLK but slightly delayed. In the example, the delay between these two clock signals is equal to about 25 ns.

The rising edges of the signal CLK2 allow generating the control signals $\Phi1$ and $\Phi2$ for the switches which control the operation of the comparator 20 in the first phase or the second phase which were discussed above with reference to the diagram in FIG. 7. These signals are at the same frequency as the signal CLK and the signal CLK2. They are in phase opposition, and do not overlap. This means that they are not simultaneously in the high state.

Figures 8E, 8F, 8G:
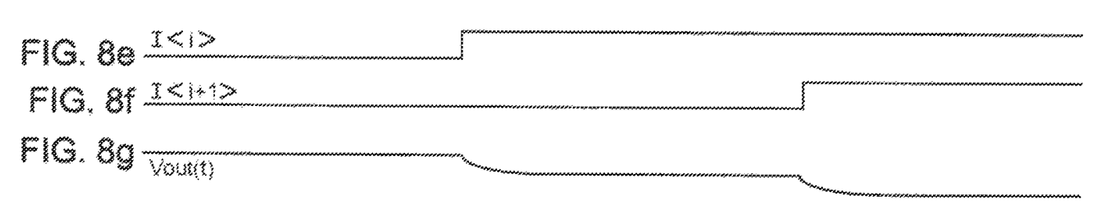

As was already stated above, the counter 30 is activated by the rising edges of the signal $\Phi2$. As long as the output voltage Vout(t) from the amplifier 10, which corresponds to the offset of this amplifier in the absence of a signal VIN to be amplified, is not zero, the output signal COMP from the comparator 20 is in the high state when this produces a rising edge of the signal $\Phi2$. As a result the counter 30 increments, i.e., changes state as shown in the state diagram described with reference to FIG. 3. As a result, one more bit in the value output from the counter passes from 0 to 1. One more current source from among the sources of the matrix 43 (FIG. 4) is therefore turned on. This phenomenon is illustrated in FIGS. 8e and 8f for two sources delivering the respective currents I<i> and I<i+1>, for two consecutive rising edges of the signal $\Phi2$. The effect this produces on the output voltage Vout(t) from the amplifier 10 is illustrated by FIG. 8g. As one can see, each time a voltage source is turned on, the voltage Vout(t) decreases by a step corresponding to the value Io of the current delivered by this source.

Figure 8H:
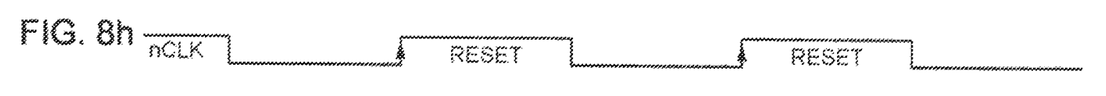

FIG. 8h illustrates the appearance of the clock signal nCLK which is the logical inverse of the signal CLK. Remember that when this signal is in the logical high state, the latch 63 of the comparator 20 is in the reset state.

Figure 8I:
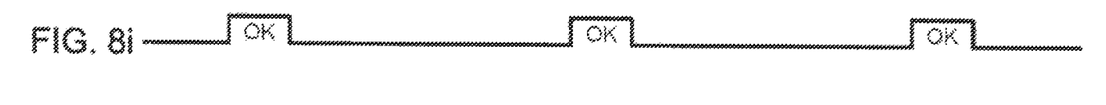

Lastly, FIG. 8i does not show a signal that can be found in the operation of the circuit, but illustrates time windows during which the signal COMP that is output from the comparator 20 can be fixed, by sampling the voltage Vcomp(t) with the aid of the latch 63. It cannot be within the first phase of operation of the input stage 61 during which this stage is in voltage follower mode, and the latch 63 must not be in the reset state. In other words, the signal $\Phi1$ must be in the low state as must the signal CLK.

Figure 9:
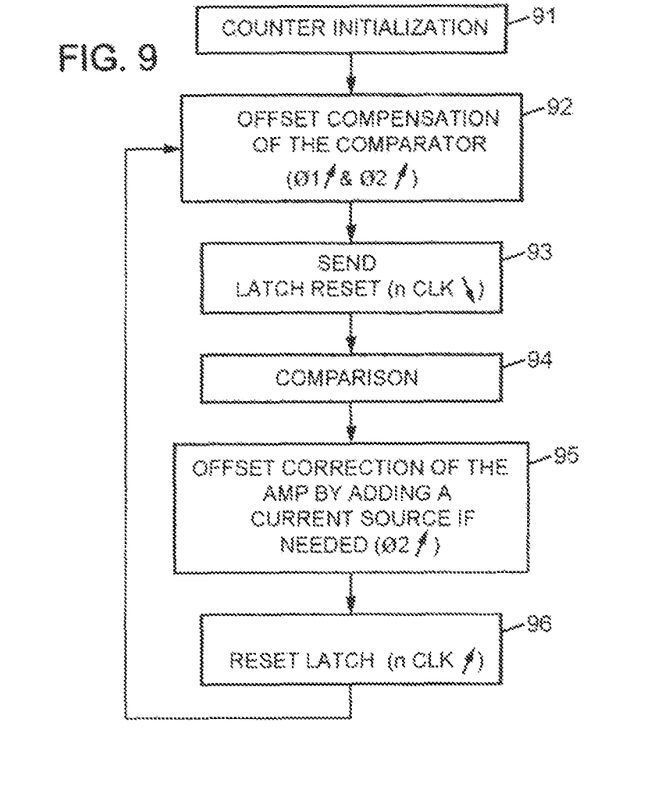
FIG. 9 is a diagram of steps of a method that implements the amplification circuit.

FIG. 9 schematically represents the steps of a method for implementing an amplification circuit. These are steps carried out in each period of the clock signal. The steps correspond to transitions of the signals which were discussed above with reference to FIGS. 8a-8h. Although they are represented sequentially for clarity in the discussion, in actuality these steps sometimes overlap each other. The order of their presentation in FIG. 9 virtually corresponds, however, to the order in which these steps are performed. First, the counter 30 is reset in a step 91. For example, this reset can be caused by powering on the circuit. For this purpose, a Power-on-Reset (POR) unit can activate a reset input for the counter 30. The counter is then in the initial state shown at the top of FIG. 3, which corresponds to the value 000 . . . 0 of the n-bit signal COR.

Then, during each period of the clock signal, the steps 92 to 96 are carried out.

First, the offset of the comparator 20 is compensated for by placing it successively in the first operating phase then in the second operating phase. This occurs on the rising edges of the respective signals $\Phi1$ and $\Phi2$. This corresponds to the step denoted by 92.

In a step 93, the reset command for the latch 63 of the comparator is sent. This takes place in a step 93, on the falling edge of the signal nCLK.

In a step 94, the comparison is then made between the output voltage Vout(t) and the zero voltage. This occurs as soon as the signal nCLK is reset to the low state, which occurs while the comparator is in the second phase (signal $\Phi1$ in the low state and signal $\Phi2$ in the high state).

In the step 95, an offset correction of the amplifier 10 is made when necessary. This occurs by adding a current source from the matrix 43, via the change to 1 of an additional bit in the signal COR. This occurs on a rising edge of the signal $\Phi2$.

Then, in a step 96, the latch 63 is reset to zero, which occurs on the next rising edge of the signal nCLK.

The steps 92 to 96 are then repeated. As was already stated above, the system is calibrated so that the number of repetitions of these steps is automatically less than or equal to n. In other words, the offset cancellation for the amplifier takes a period of time which is at most equal to n times the period of the clock signal. In one example, n=94 and the clock frequency is equal to 32 kHz. The offset cancellation therefore takes less than 3 ms.

Figure 10:
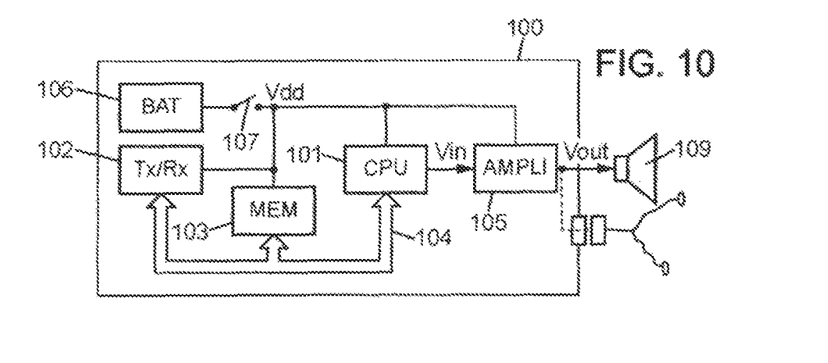
FIG. 10 is a simplified diagram of a device incorporating the amplification circuit.

The block diagram in FIG. 10 shows the elements of a device incorporating an audio amplifier as presented above. Such a device can be a mobile telephone or any other telephone, or any other device for communication.

The device 100 comprises a control unit 101 such as a processor (CPU), and a communication unit 102 for sending and receiving information from the outside, in particular by modulating a radio frequency carrier. It also comprises a memory 103 which can store information in digital form, for example a piece of music. The processor 101 communicates with the unit 102 and the memory 103 via a communication bus 104. Each of these elements is powered by the supply voltage Vdd delivered by a battery 106 through a control switch 107.

At power-on, this switch 107 is closed. The processor 101 generates an audio signal Vin to be amplified, either from data received via the unit 102, or from data read from the memory 103. To amplify this signal Vin, the device 100 comprises an audio amplifier 105 whose embodiments have been described above. This amplifier is also powered by the voltage Vdd supplied to it through the switch 107 once power is turned on.

The output signal Vout generated by the amp 105 drives a speaker 109, which can be internal to the circuit 100 or external. Additionally or alternatively, it can also drive a headset jack 108 of the device 100, to allow the user to listen to audio using a headset or earphones.

The invention has been described above with reference to embodiments. Any technically conceivable variation falls within the context of the present patent application.

The invention claimed is:

1. An audio amplification circuit comprising:
   an amplifier having an input for receiving an input signal (Vin), an output, and a digital control input for receiving an n-bit thermometer code, where n is an integer greater than 1;
   a comparator having a first input coupled to the output of the amplifier in order to receive an image of a signal output from the amplifier, a second input receiving a reference potential, and an output;

a thermometer counter, having a selection input coupled to the output of the comparator, and an output configured to deliver the n-bit thermometer code to the digital control input of the amplifier, the thermometer counter configured to start from an initial value in which all n-bits are a first binary value then at each count transition a bit changes from the first binary value to a second binary value, while all the other bits of the n-bits do not change value; and wherein the amplifier comprises a differential input stage having a first and a second differential branch each traversed by a bias current, with the current in the first branch being modifiable by n basic current sources, which each deliver either a basic current that is identical for all basic current sources, or no current, as a function of the binary value of one of the respective n-bits of the n-bit thermometer code received at the digital control input.

2. A circuit according to claim 1, wherein the amplifier is a class AB amplifier, and wherein the reference potential of the comparator is the ground potential.

3. A circuit according to claim 1, wherein the amplifier additionally comprises a current source acting on the second differential branch of the differential input stage in order to unbalance the respective currents in the first and second differential branches of the differential input stage, for a zero input signal and for the n-bit thermometer code corresponding to an absence of change in the bias current in the first differential branch of the differential stage.

4. A circuit according to claim 3, wherein the current source acting on the second differential branch of the differential input stage in order to unbalance the respective currents in the first and second differential branches of the differential input stage is configured to deliver a current substantially equal to $(n \times Io)/2$, where Io is the value of the basic current delivered by each of the basic current sources which allow modifying the current in the first differential branch of the differential input stage.

5. A circuit according to claim 1, wherein the comparator is an automatic zero-adjustment comparator.

6. A circuit according to claim 5, wherein the comparator comprises a first stage which is a differential stage with automatic zero adjustment, followed by a second stage which does not have automatic zero adjustment, and an analog latch.

7. A circuit according to claim 1, wherein the thermometer counter is configured to receive a clock signal input and wherein the clock signal input comprises a counter frequency equal to about 32 kHz and n is equal to 94.

8. An audio amplification method using an amplifier having an input for receiving an input signal, an output, and a digital control input for receiving a n-bit thermometer code, where n is an integer greater than 1, the method comprising:
comparing, by a comparator, an image of the output signal from the amplifier with a reference potential;
generating, by a thermometer counter having a selection input coupled to an output of the comparator, the n-bit thermometer code and providing the n-bit thermometer code to the digital control input of the amplifier; and
modifying a current in a first branch of a differential input stage of the amplifier by n basic current sources which each deliver either a basic current which is identical for all basic current sources, or no current, as a function of the binary value of each one of the respective n-bits of the n-bit thermometer code received at the digital control input;

wherein the amplifier comprises the first branch and a second branch each being configured to be traversed by a bias current.

9. A method according to claim 8, wherein, the amplifier is a class AB amplifier and the reference potential of the comparator is the ground potential.

10. A method according to claim 8, wherein for a zero input signal and for the n-bit thermometer code corresponding to an absence of change in the bias current in the first branch of the differential input stage, the respective currents in the first and second branches of the differential stage are unbalanced by using a current source acting on the second branch of the differential input stage.

11. A method according to claim 10, wherein the current source acting on the second branch of the differential stage in order to unbalance the respective currents in the first and second branches of the differential stage delivers a current substantially equal to $(n \times Io)/2$, where Io is the value of the basic current delivered by each of the basic current sources.

12. A method according claim 8, wherein an automatic zero-adjustment comparator is used for comparing an image of the output signal of the amplifier with the reference potential.

13. A method according to claim 12, wherein the comparator comprises a first amplification stage, which is a differential stage with automatic zero adjustment, followed by a second amplification stage which does not have automatic zero adjustment, and an analog latch.

14. A method according to claim 8, wherein the counter frequency of the thermometer counter is equal to about 32 kHz and n is equal to 94.

15. An electronic device comprising an audio signal source, and an amplifier according to claim 1 adapted to amplify the audio signal.

16. An audio amplification circuit comprising:
an amplifier having an input for receiving an input signal (Vin), an output, and a digital control input for receiving a control value that comprises an n-bit digital value, where n is an integer greater than 1;
a comparator having a first input coupled to the output of the amplifier in order to receive an image of a signal output from the amplifier, a second input receiving a reference potential, and an output;
a thermometer counter, having a selection input coupled to the output of the comparator, and an output configured to deliver the control value to the digital control input of the amplifier; and
wherein the amplifier comprises a differential input stage having a first and a second differential branch each traversed by a bias current, with the current in the first branch being modifiable by n basic current sources, which each deliver either a basic current that is identical for all basic current sources, or no current, as a function of the binary value of one of the respective n-bits of the control value received at the digital control input, and wherein the amplifier additionally comprises a current source acting on the second differential branch of the differential input in order to unbalance the respective currents in the first and second differential branches of the differential input stage for a zero input signal and for a control value corresponding to an absence of change in the bias current of the first differential branch of the differential input stage.

17. An audio amplification method using an amplifier having an input for receiving an input signal, an output, and a digital control input for receiving a control value comprising an n-bit digital value, where n is an integer greater than 1, the method comprising:
- comparing, by a comparator, an image of the output signal from the amplifier with a reference potential;
- generating the n-bit digital value that is provided as the control value to the digital control input of the amplifier, with a thermometer counter having a selection input coupled to an output of the comparator;
- modifying a current in a first branch of a differential input stage of the amplifier by n basic current sources which each deliver either a basic current which is identical for all basic current sources, or no current, as a function of the binary value of each one of the respective n-bits of the control value received at the digital control input; wherein the amplifier comprises the first branch and a second branch each being configured to be traversed by a bias current; and
- wherein for a zero input signal and for a control value corresponding to an absence of change in the bias current in the first branch of the differential input stage, the respective currents in the first and second branches of the differential input stage are unbalanced by using a current source acting on the second branch of the differential input stage.

18. An audio amplification circuit comprising:
- an amplifier having an input for receiving an input signal (Vin), an output, and a digital control input for receiving a control value that comprises an n-bit digital value, where n is an integer greater than 1;
- a comparator having a first input coupled to the output of the amplifier in order to receive an image of a signal output from the amplifier, a second input receiving a reference potential, and an output, wherein the comparator is an automatic zero-adjustment comparator comprising a first differential stage having automatic zero-adjustment followed by a second stage does not have automatic zero-adjustment, and an analog latch;
- a thermometer counter, having a selection input coupled to the output of the comparator, and an output configured to deliver the control value to the digital control input of the amplifier; and
- wherein the amplifier comprises a differential input stage having a first and a second differential branch each traversed by a bias current, with the current in the first branch being modifiable by n basic current sources, which each deliver either a basic current that is identical for all basic current sources, or no current, as a function of the binary value of one of the respective n-bits of the control value received at the digital control input.

19. An audio amplification method using an amplifier having an input for receiving an input signal, an output, and a digital control input for receiving a control value comprising an n-bit digital value, where n is an integer greater than 1, the method comprising:
- comparing, by a comparator, an image of the output signal from the amplifier with a reference potential, wherein the comparator comprises a first amplification stage, which is a differential stage with automatic zero adjustment, followed by a second amplification stage which does not have automatic zero adjustment, and an analog latch;
- generating the n-bit digital value that is provided as the control value to the digital control input of the amplifier, with a thermometer counter having a selection input coupled to an output of the comparator; and
- modifying a current in a first branch of a differential input stage of the amplifier by n basic current sources which each deliver either a basic current which is identical for all basic current sources, or no current, as a function of the binary value of each one of the respective n-bits of the control value received at the digital control input; wherein the amplifier comprises the first branch and a second branch each being configured to be traversed by a bias current.

* * * * *